US009296180B2

(12) United States Patent
Terashima et al.

(10) Patent No.: US 9,296,180 B2
(45) Date of Patent: Mar. 29, 2016

(54) METAL FOIL FOR BASE MATERIAL

(75) Inventors: Shinichi Terashima, Tokyo (JP);
Takayuki Kobayashi, Tokyo (JP);
Masamoto Tanaka, Tokyo (JP);
Masami Fujishima, Iruma (JP); Masao Kurosaki, Tokyo (JP); Jun Maki, Tokyo (JP); Hideaki Suda, Tokyo (JP); Shuji Nagasaki, Tokyo (JP)

(73) Assignees: NIPPON STEEL & SUMIKIN MATERIALS CO., LTD., Tokyo (JP);
NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days.

(21) Appl. No.: 13/885,278

(22) PCT Filed: Nov. 16, 2011

(86) PCT No.: PCT/JP2011/076400
§ 371 (c)(1),
(2), (4) Date: May 14, 2013

(87) PCT Pub. No.: WO2012/067146
PCT Pub. Date: May 24, 2012

(65) Prior Publication Data
US 2013/0236737 A1  Sep. 12, 2013

(30) Foreign Application Priority Data

Nov. 17, 2010  (JP) ................ 2010-257322

(51) Int. Cl.
| H01L 51/00 | (2006.01) |
| B32B 15/01 | (2006.01) |
| C23C 2/12 | (2006.01) |
| C23C 2/26 | (2006.01) |
| H01L 31/0392 | (2006.01) |
| H01L 31/02 | (2006.01) |
| C23C 2/02 | (2006.01) |
| C25D 3/04 | (2006.01) |
| C23C 8/24 | (2006.01) |
| C23C 14/14 | (2006.01) |
| C23C 18/12 | (2006.01) |
| C23C 28/00 | (2006.01) |
| C25D 5/12 | (2006.01) |
| C25D 5/48 | (2006.01) |
| C25D 5/50 | (2006.01) |
| C25D 7/06 | (2006.01) |
| C23C 18/16 | (2006.01) |
| C23C 2/40 | (2006.01) |
| C23C 8/02 | (2006.01) |
| C25D 11/08 | (2006.01) |

(52) U.S. Cl.
CPC .............. *B32B 15/012* (2013.01); *C23C 2/02* (2013.01); *C23C 2/12* (2013.01); *C23C 2/26* (2013.01); *C23C 2/40* (2013.01); *C23C 8/02* (2013.01); *C23C 8/24* (2013.01); *C23C 14/14* (2013.01); *C23C 18/125* (2013.01); *C23C 18/1651* (2013.01); *C23C 28/321* (2013.01); *C23C 28/34* (2013.01); *C23C 28/345* (2013.01); *C25D 3/04* (2013.01); *C25D 5/12* (2013.01); *C25D 5/48* (2013.01); *C25D 5/50* (2013.01); *C25D 7/0614* (2013.01); *H01L 31/02* (2013.01); *H01L 31/0392* (2013.01); *H01L 31/03923* (2013.01); *H01L 31/03925* (2013.01); *C23C 18/1254* (2013.01); *C25D 11/08* (2013.01); *H01L 51/0096* (2013.01); *Y02E 10/541* (2013.01); *Y10T 428/12438* (2015.01)

(58) Field of Classification Search
None
See application file for complete search history.

(56) References Cited

U.S. PATENT DOCUMENTS

| 4,686,155 | A | | 8/1987 | Kilbane et al. |
| 5,981,089 | A | * | 11/1999 | Imai et al. ................. 428/668 |
| 6,017,643 | A | | 1/2000 | Kobayashi et al. |
| 2006/0166029 | A1 | | 7/2006 | Inaguma et al. |

FOREIGN PATENT DOCUMENTS

| CN | 1527071 | 9/2004 |
| CN | 1209481 | 7/2005 |
| CN | 101817128 | 9/2010 |
| JP | 61-281861 | 12/1986 |
| JP | 64-028349 | 1/1989 |
| JP | 01-150404 | 6/1989 |
| JP | 04-250995 | 9/1992 |
| JP | 2002-093573 | 3/2002 |
| JP | 2006-080370 | 3/2006 |

(Continued)

OTHER PUBLICATIONS

International Search Report dated Dec. 27, 2011, issued in corresponding PCT Application No. PCT/JP2011/076400.

(Continued)

*Primary Examiner* — Adam Krupicka
(74) *Attorney, Agent, or Firm* — Kenyon & Kenyon LLP

(57) ABSTRACT

A metal foil including: a steel layer whose thickness is 10 to 200 μm; an alloy layer which contains Fe and Al and which is formed on the steel layer; and an Al-containing metal layer arranged on the alloy layer, wherein, when a cutting-plane line of a surface of the Al-containing metal layer is defined as a contour curve and an approximation straight line of the contour curve is defined as a contour average straight line, a maximum point, whose distance from the contour average straight line is more than 10 μm, is absent on the contour curve, and a thickness of the alloy layer is 0.1 to 8 μm and the alloy layer contains an $Al_7Cu_2Fe$ intermetallic compound or $FeAl_3$ based intermetallic compounds.

8 Claims, No Drawings

(56) References Cited

FOREIGN PATENT DOCUMENTS

| | | |
|---|---|---|
| JP | 2006-295035 | 10/2006 |
| WO | WO2010/082678 | 7/2010 |

OTHER PUBLICATIONS

International Search Report dated Dec. 27, 2011, issued in related PCT Application No. PCT/JP2011/076390.

Office Action dated Sep. 1, 2014 issued in Chinese Application No. 2011-80054765.8 [with English Translation].

Office Action dated Jul. 2, 2014 issued in Chinese Application No. 2011-8005427.2 [with English Translation].

Office Action dated Jul. 2, 2014 issued in Chinese Application No. 2011-80054727.2 [with English Translation].

Office Action issued on Feb. 8, 2016 in a corresponding U.S. Appl. No. 13/885,309.

* cited by examiner

METAL FOIL FOR BASE MATERIAL

This application is a national stage application of International Application No. PCT/JP2011/076400, filed Nov. 16, 2011, which claims priority to Japanese Patent Application No. 2010-257322, filed Nov. 17, 2010, the content of which is incorporated herein by reference.

TECHNICAL FIELD

The present invention relates to a metal foil which is utilized for base materials of compound solar cells, thin film solar cells, hybrid solar cells in which a plurality of the solar cells are layered, and organic electroluminescence illuminations.

BACKGROUND ART

In the compound solar cells such as CIGS (Copper-Indium-Gallium-Selenium), CIS (Copper-Indium-Selenium), CdTe (Cadmium-Tellur), or the like, the thin film solar cells such as amorphous Si or the like, the hybrid solar cells in which a plurality of the solar cells are layered, and the organic EL (electroluminescence) illuminations, foundations called base materials are utilized in order to structurally support the CIGS layer, the CIS layer, the CdTe layer, the amorphous Si layer, the organic EL layer, or the like.

Conventionally, as described in Patent Document 1, glass base materials are frequently utilized as the base materials. However, since the glass is fragile, the glass base materials need to be thickened in order to ensure predetermined strength. Thickening the glass base materials results in an increase in weight of the solar cells and the organic EL illuminations in itself.

On the other hand, metal foils are recently tried to be utilized as the base materials instead of the glass base materials. The metal foil is not fragile, and can be suitably thinned. It is required for the metal foils utilized as the base materials that all of corrosion resistance, surface smoothness, and elastoplastic deformability are excellent.

The corrosion resistance is required in order to be capable of exposing the metal foils utilized as the base materials to an outdoor environment for prolonged periods which are considered to be 20 years.

The surface smoothness is required in order to prevent the solar cell layer or the organic EL layer which is layered on the base material from being physically damaged by protruding defects which exist on a surface of the base material. It is desirable that the surface of the base materials is a smooth surface which does not include the protruding defects.

The elastoplastic deformability is required in order to be capable of coiling the metal foil for the base material so as to be a roll shape, which is impossible by using the glass base materials which are hard. As a result, if production by a batch processing is changed into continuous production by a Roll-to-Roll processing, a production cost for the solar cells and the organic EL can be drastically reduced.

In general, as the metal foils for the base materials, stainless steel (SUS) foils which are excellent in the corrosion resistance are tried to be utilized. As described in Patent Document 2, the base materials in which an organic film is further formed on the SUS foils may be utilized.

Since the SUS foils are excellent in the corrosion resistance, the SUS foils are utilized as the metal foils for the base materials. However, there is a problem in that the SUS foils are expensive as materials. Moreover, since the SUS foils are hard and are not readily subjected to a rolling process, there is a problem in that the production cost is expensive. Thus, the utilization thereof is not pervasive in the present circumstances as compared with the glass base materials.

On the other hand, since plain steel (carbon steel) foils are inexpensive as the materials as compared with the SUS and have excellent deformability, the production cost can be drastically reduced. However, in case of the plain steel foils in itself, the corrosion resistance which is required as the metal foils for the base materials cannot be satisfied. If the plain steel foils which satisfy the above-mentioned properties required as the metal foils for the base materials are utilizable, the production cost for the solar cells and the organic EL can be drastically reduced. Therefore, development thereof is eagerly anticipated at present.

RELATED ART DOCUMENTS

Patent Documents

[Patent Document 1] Japanese Unexamined Patent Application, First Publication No. 2006-80370

[Patent Document 2] Japanese Unexamined Patent Application, First Publication No. 2006-295035

SUMMARY OF INVENTION

Problems to be Solved by Invention

In view of the above-mentioned situations, an object of an aspect of the invention is to provide a metal foil for base materials which simultaneously satisfies corrosion resistance, surface smoothness, and elastoplastic deformability required as the metal foil for the base materials of solar cells and organic EL at a low cost.

Solution to Problem

An aspect of the present invention employs the following.

(1) A metal foil for a base material according to an aspect of the invention includes a steel layer whose thickness is 10 to 200 μm; an alloy layer which contains Fe and Al and which is formed on the steel layer; and an Al-containing metal layer arranged on the alloy layer, wherein, when a cutting-plane line of a surface of the Al-containing metal layer, which appears on a cross-section of the metal foil that is planarly cut along a normal direction so that an observed section is a transverse direction perpendicular to a rolling direction, is defined as a contour curve and an approximation straight line of the contour curve, which appears on the cross-section, is defined as a contour average straight line, a maximum point, which is convex toward the surface of the Al-containing metal layer and whose distance from the contour average straight line is more than 10 μm, is absent on the contour curve, and wherein a thickness of the alloy layer is 0.1 to 8 μm and the alloy layer contains an $Al_7Cu_2Fe$ intermetallic compound or $FeAl_3$ based intermetallic compounds.

(2) The metal foil for the base material according to (1) may further includes a Cu layer whose thickness is 2 to 10 μm or a Ni layer whose thickness is 2 to 10 μm between the steel layer and the alloy layer.

(3) In the metal foil for the base material according to (1) or (2), a thickness of the Al-containing metal layer may be 0.1 to 30 μm.

(4) The metal foil for the base material according to any one of (1) to (3) may further includes an AlN layer whose thickness is 0.01 to 0.08 μm or an $Al_2O_3$ layer whose thickness is 0.01 to 50 μm on the Al-containing metal layer.

(5) The metal foil for the base material according to any one of (1) to (3) may further includes a Cr layer whose thickness is 0.1 to 8 μm or a Ni layer whose thickness is 0.1 to 8 μm on the Al-containing metal layer.

(6) The metal foil for the base material according to any one of (1) to (3) may further includes at least a film selected from a sol-gel layer and a lamination layer on the Al-containing metal layer.

Advantageous Effects of Invention

According to the above aspects of the present invention, it is possible to provide a metal foil for base materials which is not fragile as compared with glass base materials, is suitably thinned, and simultaneously satisfies corrosion resistance, surface smoothness, and elastoplastic deformability required as the metal foil for the base materials. Therefore, it is possible to produce, at a low cost, compound solar cells such as CIGS, CIS, CdTe, or the like, thin film solar cells such as amorphous Si or the like, hybrid solar cells in which a plurality of the solar cells are layered, and organic EL illuminations, which are thin and light.

DESCRIPTION OF EMBODIMENTS

Hereinafter, a preferable embodiment of the present invention will be described in detail. First, technical components and reasons for limitation ranges of a metal foil for base materials will be described in detail.

In order to improve corrosion resistance of plain steel (carbon steel), the plain steel is subjected to coating containing Al. By the Al-containing coating, an Al-containing metal layer is arranged on a steel layer. Due to the Al-containing metal layer, the corrosion resistance required as the metal foil for the base materials is improved.

It is preferable that composition of the Al-containing metal layer includes 60 to 100 mass % of Al, 0 to 15 mass % of Si, and 0 to 40 mass % of Cu. Since a melting point of coating bath decreases due to the composition, a coating process is simplified. It is more preferable that the Al-containing metal layer has a composition in which each element is within a range of plus or minus 5 mass % on the basis of a composition which is 68.2 mass % of Al, 4.7 mass % of Si, and 27.1 mass % of Cu or a composition which is 68 mass % of Al and 32 mass % of Cu. The melting point of the coating bath further decreases due to the composition. In addition, it is preferable that a thickness of the Al-containing metal layer is 0.1 to 30 μm. When the thickness is less than 0.1 μm, the suitable corrosion resistance may not be obtained. When the thickness is more than 30 μm, it is necessary to excessively coat Al, and a production cost may increase. Preferably, the thickness of the Al-containing metal layer may be 1 to 30 μm. More preferably, the thickness of the Al-containing metal layer may be 3 to 30 μm. Most preferably, the thickness of the Al-containing metal layer may be 8 to 30 μm.

In general, by the Al-containing coating, Fe—Al alloy phase (for example, intermetallic compounds such as $FeAl_3$, $Fe_2Al_8Si$, $FeAl_5Si$, or the like) is formed so as to be layered at an interface between the steel layer and the Al-containing metal layer. The alloy layer is very hard and brittle. When the metal foil subjected to the Al-containing coating is elastoplastically deformed for an operation, the alloy layer cannot accompany the deformation of the metal foil, and finally, exfoliation of the Al-containing metal layer from the steel layer and crack of the Al-containing metal are induced. Thus, in a case where the plain steel is subjected to the Al-containing coating, the corrosion resistance required as the metal foil for the base materials is indeed satisfied, but elastoplastic deformability is not satisfied.

In order to improve the elastoplastic deformability required as the metal foil for the base materials, it is necessary that, in the alloy layer which is formed at the interface between the steel layer and the Al-containing metal layer, a thickness is 0.1 to 8 μm and an $Al_7Cu_2Fe$ intermetallic compound or $FeAl_3$ based intermetallic compounds are contained. It is preferable that an area fraction in units of area % of the $Al_7Cu_2Fe$ intermetallic compound or the $FeAl_3$ based intermetallic compounds in the alloy layer is 50% or more. It is more preferable that the area fraction is 90% or more.

Herein, the $FeAl_3$ based intermetallic compounds express intermetallic compounds in which constituent elements of the metal foil (for example, constituent elements of the Al-containing metal layer such as Si, Cu, or the like, constituent elements of pre-coating film such as Ni, Cu, or the like, or constituent elements of the steel layer such as C, P, Cr, Ni, Mo, or the like) are solid-soluted in the $FeAl_3$ intermetallic compound, and express intermetallic compounds which is formed so as to have a new composition ratio by alloying Fe and Al with the constituent elements of the metal foil. It is preferable that the $FeAl_3$ based intermetallic compounds are $FeAl_3$ based intermetallic compound in which Cu is solid-soluted or $FeAl_3$ based intermetallic compound in which Ni is solid-soluted in particular. However, as described later, as long as Vickers hardness of the alloy layer is approximately 500 to 600 Hv, solid-soluted elements are not limited to Ni or Cu.

The alloy layer which contains the $Al_7Cu_2Fe$ intermetallic compound or the $FeAl_3$ based intermetallic compounds is formed by alloying Fe and Al with the constituent elements of the metal foil which diffuse from Cu or Ni pre-coating film as described later, the steel layer, and the Al-containing metal layer, when the plain steel is subjected to the Al-containing coating. Specifically, in order to preferably form the alloy layer which contains the $Al_7Cu_2Fe$ intermetallic compound or the $FeAl_3$ based intermetallic compounds, it is preferable that the Cu or Ni pre-coating film is formed on the steel layer by subjecting the plain steel to Cu or Ni pre-coating treatment in advance before conducting the Al-containing coating. However, since the alloy layer can be formed, for example, by the diffusion of the constituent elements of the steel layer and the Al-containing metal layer, the Cu or Ni pre-coating film is not an essential component.

The alloy layer which contains the $Al_7Cu_2Fe$ intermetallic compound or the $FeAl_3$ based intermetallic compounds has the Vickers hardness of 500 to 600 Hv. The above-mentioned conventional alloy layer which is hard and brittle has Vickers hardness of approximately 900 Hv. Specifically, by controlling the alloy layer to be the relative soft layer, it is possible to improve the elastoplastic deformability of the metal foil. In addition, when the thickness of the alloy layer is less than 0.1 μm, the effect of the soft alloy layer is not obtained. When the thickness is more than 8 μm, the diffusion of the constituent elements of the metal foil is excessively accelerated and Kirkendall voids tend to be formed, which is not preferable.

In order to further improve the elastoplastic deformability of the metal foil, it is preferable that the thickness of the alloy layer is 0.1 to 5 μm. Moreover, in order to further improve the corrosion resistance of the metal foil, it is preferable that the thickness is 3 to 8 μm. In order to simultaneously obtain both effects, it is most preferable that the thickness of the alloy layer is 3 to 5 μm.

In addition, in order to improve the elastoplastic deformability by further increasing adhesion between the steel layer and the alloy layer, it is preferable that Cu layer or Ni layer is arranged by remaining the Cu or Ni pre-coating film so that a thickness is 2 to 10 μm between the steel layer and the alloy layer. Consequently, even if severe deformation is conducted during pressing, deep drawing, or the like, exfoliation of the alloy layer hardly occurs.

The existence of the Cu layer or the Ni layer between the steel layer and the alloy layer does not suppress the above-mentioned effect derived from the alloy layer. However, when the thickness of the Cu layer or the Ni layer is less than 2 μm, the effect such that the adhesion between the steel layer and the alloy layer is improved may not be obtained. When the thickness is more than 10 μm, the effect may be saturated and a cost for coating the pre-coating film may increase, which is not preferable.

In addition, a thickness of the steel layer of the metal foil is to be 10 to 200 μm. In order to produce a foil having the thickness of less than 10 μm, careful control of precision machine is necessary, which results in a high cost. When the thickness is more than 200 μm, the weight of the metal foil increases and a merit of utilizing the foil is not sufficiently obtained. In order to reduce the weight of the base material, it is preferable that the thickness is 10 to 150 μm. Moreover, in order to strengthen the material and to install heavy goods on the base material, it is preferable that the thickness is 100 to 200 μm. In order to simultaneously obtain both effects, it is most preferable that the thickness of the steel layer is 100 to 150 μm.

It is important that the metal foil for the base materials of the solar cells and the organic EL satisfies surface smoothness at the same time in addition to the corrosion resistance and the elastoplastic deformability.

In order to satisfy the surface smoothness required as the metal foil for the base materials, it is necessary that a surface of the Al-containing metal layer is a predetermined smooth surface. Specifically, when a cutting-plane line of the surface of the Al-containing metal layer, which appears on a cross-section of the metal foil that is planarly cut along a normal direction so that an observed section is a transverse direction perpendicular to a rolling direction, is defined as a contour curve and an approximation straight line of the contour curve, which appears on the cross-section, is defined as a contour average straight line, a maximum point, whose distance from the contour average straight line is more than 10 μm, is absent on the contour curve.

Herein, the maximum point indicates an extremal point which is convex toward the surface of the Al-containing metal layer on the contour curve. In addition, since a minimum point of the contour curve (an extremal point which is concave toward the surface of the Al-containing metal layer on the contour curve) does not physically damage the solar cell layer or the organic EL layer which is layered on the base material, the existence thereof does not matter.

The contour curve may be obtained from a locus thereof on metallographic micrographs of the cross-section by image analysis or by hand. Similarly, in a case where the contour curve is obtained by the image analysis, the contour average straight line may be obtained by applying a phase compensating filter for the image analysis. In a case where the contour curve is obtained by hand, the contour average straight line may be obtained by a least-square method for coordinate values of the extremal points.

When the surface of the Al-containing metal layer has a protruding defect of more than 10 μm, the solar cell layer or the organic EL layer which is layered on the base material may be physically damaged. For example, if the solar cell layer on the base material of the solar cell is damaged as described above, photoelectric conversion efficiency in the area may decrease.

In order to sufficiently obtain the photoelectric conversion efficiency, it is preferable that a maximum point, whose distance from the contour average straight line is more than 5 μm, is absent. It is more preferable that a maximum point of more than 1 μm is absent.

In addition, it is preferable that glossiness of the surface of the Al-containing metal layer is 75% or more as compared with a silver mirror. For example, in the solar cells, some solar light is transmitted to the metal foil which is the base material without contributing to the photoelectric conversion at incidence. In a case where the transmitted solar light is reflected by the metal foil, the reflected solar light contributes to the photoelectric conversion. In order that the transmitted solar light contributes efficiently to the photoelectric conversion, it is preferable that the glossiness is 75% or more as compared with the silver mirror. It is more preferable that the glossiness is 80% or more as compared with the silver mirror.

The surface smoothness and the glossiness as mentioned above are achieved by using a rolling roll having a mirror finished surface at second rolling process or by subjecting the metal foil after the second rolling process to skin-pass rolling. A producing method according to the embodiment of the present invention will be described in detail.

In addition, it is preferable that an AlN layer whose thickness is 0.01 to 0.08 μm or an $Al_2O_3$ layer whose thickness is 0.01 to 50 μm is further arranged on the Al-containing metal layer. If Fe atoms diffuse from the steel layer to the solar cell layer, the organic EL layer, or the like, functions of the layers may deteriorate. For example, in a case where the Fe atoms diffuse from the steel layer to CIGS layer, CIS layer, or the like of the solar cell layer, the conversion efficiency of the solar cell may deteriorate due to narrowing bandgap. The AlN layer or the $Al_2O_3$ layer acts as a barrier film and can prevent the Fe atoms which are constituent element of the steel layer from diffusing and reaching the CIGS layer, the CIS layer, or the like. However, when the thicknesses thereof are less than 0.01 μm, the above-mentioned effect may not be obtained. In order to form the AlN layer whose thickness is more than 0.08 μm or the $Al_2O_3$ layer whose thickness is more than 50 μm, the production cost may increase, which is not preferable. When the thickness of the $Al_2O_3$ layer is excessively thick, the anodized film may be exfoliated from the aluminum, so that it is preferable that the thickness is 50 μm or less. It is more preferable that the thickness is 15 μm or less. From a standpoint of suppression of thermal expansion of the aluminum and insulation properties, it is most preferable that the thickness is 0.08 μm or less. Moreover, since the above-mentioned suppression effect of the diffusion is not obtained from a naturally made AlN layer or $Al_2O_3$ layer, it is necessary to purposely form the dense layer.

Instead of the AlN layer or the $Al_2O_3$ layer, a Cr layer whose thickness is 0.1 to 8 μm or a Ni layer whose thickness is 0.1 to 8 μm may be arranged on the Al-containing metal layer. By arranging the Cr layer or the Ni layer, the same effects derived from the AlN layer or the $Al_2O_3$ layer can be obtained. When the thickness of the Cr layer or the Ni layer is less than 0.1 μm, the above-mentioned effects may not be obtained. When the thickness is more than 8 μm, the production cost may increase.

Instead of the AlN layer or the $Al_2O_3$ layer, a sol-gel layer whose thickness is 0.001 to 8 μm may be arranged on the Al-containing metal layer. The sol-gel layer has an inorganic framework in which a main framework is siloxane bond grown to a three-dimensional network, and organic groups and/or hydrogen atom are substituted for at least one of bridging oxygen of the framework in the sol-gel layer. By arranging the sol-gel layer, the same effects derived from the AlN layer or the $Al_2O_3$ layer can be obtained. In order to further improve the effects, it is more preferable that the thickness is 0.1 μm or more. When the thickness of the sol-gel layer is less than 0.001 μm, the above-mentioned effects may not be obtained. When the thickness is more than 8 μm, the production cost may increase.

Instead of the AlN layer or the $Al_2O_3$ layer, a lamination layer whose thickness is 0.1 to 8 μm may be arranged on the Al-containing metal layer. The lamination layer is made of a plastic film or the like which is selected from polyolefin, polyester, polyamide, and polyimide. Moreover, instead of the lamination layer, high-temperature resin which is made from the polyimide may be utilized. By arranging the lamination layer or the high-temperature resin, the same effects derived from the AlN layer or the $Al_2O_3$ layer can be obtained. When the thickness of the lamination layer is less than 0.1 μm, the above-mentioned effects may not be obtained. When the thickness is more than 8 μm, the production cost may increase.

By having the components, for example, it is possible to obtain withstand voltage of 500 V or more and to avoid a dielectric breakdown in modular circuits in which the solar cells of CIGS are series-connected. Moreover, even if the dielectric breakdown does not occur, the photoelectric conversion efficiency of the solar cell modules tends to deteriorate when leakage current flows. However, by having the components, it is possible to avoid the leakage.

For a method for measuring the thickness and the composition of each layer as mentioned above, technique in which analysis is conducted with digging along the normal direction from the surface of the metal foil by sputtering or technique in which point analysis or linear analysis is conducted at the cross-section along the normal direction of the metal foil is effective. Although measuring time in the former technique is excessively prolonged in a case where measuring depth is deep, it is possible with comparative ease to conduct the measurement of concentration distribution throughout the cross-section, confirmation of repeatability, or the like in the latter technique. In order to improve the precision of the point analysis or the linear analysis, it is effective that the analysis is conducted with a small measuring interval in the linear analysis or with a high magnification of the measuring area in the point analysis. Identification of each layer is conducted by measuring a value of a standard sample (specifically, concentration of 100%) in advance and by identifying an area where the concentration is 50% or more in the composition analysis. As an analyzer used for the analysis, it is possible to utilize EPMA (Electron Probe Micro Analysis), EDX (Energy Dispersive X-Ray Analysis), AES (Auger Electron Spectroscopy), TEM (Transmission Electron Microscope), or the like. Moreover, for judging whether the thickness of each layer satisfies the above-mentioned limitation range or not, an average thickness of each layer is evaluated. Even if the thickness of each layer does not locally satisfy the limitation range, this is not considered for the judgment.

By making the metal foil have the technical components, it is possible to simultaneously satisfy the corrosion resistance, the surface smoothness, and the elastoplastic deformability required as the metal foil for the base materials. In addition, the metal foil can be utilized for the base materials of the solar cells and the organic EL.

As a photoelectric conversion layer formed on the base material, it is possible to utilize compound solar cells such as CIGS, CIS, CdTe, or the like, thin film solar cells such as amorphous Si or the like, and hybrid solar cells in which a plurality of the solar cells are layered, or it is possible to form circuits of organic EL illuminations on the base material. In particular, a main composition of the above-mentioned CIGS or CIS may not be particularly limited, and it is preferable that the main composition is at least one of compound semiconductors which have Chalcopyrite structure. Moreover, it is preferable that the main composition of the photoelectric conversion layer is at least one of compound semiconductors which include group Ib element, group IIIB element, and group VIb element. Moreover, since high optical absorptance and high photoelectric conversion efficiency are obtained, it is preferable that the main composition of the photoelectric conversion layer is at least one of compound semiconductors which include at least one of group Ib elements selected from Cu, Ag, and the like, at least one of group IIIb elements selected from Al, Ga, In, and the like, and at least one of group VIb elements selected from S, Se, Te, and the like. Specifically, as the compound semiconductors, it is possible to utilize $CuAlS_2$, $CuGaS_2$, $CuInS_2$, $CuAlSe_2$, $CuGaSe_2$, $CuInSe_2$ (CIS), $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In_{1-x}Ga_x)Se_2$ (CIGS), $Cu(In_{1-x}Al_x)Se_2$, $Cu(In_{1-x}Ga_x)(S, Se)_2$, $Ag(In_{1-x}Ga_x)Se_2$, $Ag(In_{1-x}Ga_x)(S, Se)_2$, or the like.

Next, the producing method of the metal foil for the base material according to the embodiment of the present invention will be described in detail.

As a first rolling process, the plain steel (carbon steel) sheet having an arbitrary composition is rolled to a thickness of 200 to 500 μm. The rolling process may be any of hot rolling and cold rolling. When the thickness of the steel sheet is less than 200 μm, the handling in post-processes is difficult because of excessive thinness. Moreover, when the thickness of the steel sheet is more than 500 μm, the load in the post-processes is large because of excessive thickness.

In consideration of productivity in the post-processes, as the first rolling process, it is preferable that the rolling is conducted so as to be a thickness of 250 to 350 μm.

For the steel sheet after the first rolling process, a pre-coating process in which the Cu or Ni pre-coating is conducted, a coating process in which the Al-containing coating is conducted, and a second rolling process are conducted. Order of the processes may be any of the followings, (1) the pre-coating process, the coating process, and the second rolling process, (2) the pre-coating process, the second rolling process, and the coating process, and (3) the second rolling process, the pre-coating process, and the coating process.

As the pre-coating process, an electrolytic-coating method or a nonelectrolytic-coating method is conducted by using coating bath of Cu or Ni. When an initial thickness of pre-coating film is 0.05 to 4 μm in both the Cu pre-coating film and the Ni pre-coating film, the thickness of the alloy layer which is formed between the steel layer and the Al-containing metal layer during the Al-containing coating is to be 0.1 to 8 μm. For example, in order to control the thickness of the alloy layer formed during the Al-containing coating to 3 to 5 μm which is most preferable as mentioned above, the initial thickness of the pre-coating film may be controlled to be 1.5 to 2.5 μm.

Moreover, in order to arrange the Cu layer or the Ni layer between the steel layer and the alloy layer by remaining the Cu or Ni pre-coating film, the initial thickness of the pre-coating film may be controlled to be a thickness in which a thickness to be remained is added to a criterial thickness of 4 μm. The Cu or Ni pre-coating film having the thickness of 4 μm or less disappears due to diffusing to the alloy layer formed during the Al-containing coating. The pre-coating film having the thickness of more than 4 μm is to be the Cu layer or the Ni layer since a thickness in which 4 μm is subtracted from the thickness thereof remains. For example, in order to arrange the Cu layer or the Ni layer having a thickness of 5 μm between the steel layer and the alloy layer, the initial thickness of the pre-coating film may be controlled to be a thickness of 9 μm=4+5.

In order to form the alloy layer without conducting the pre-coating process, compositions of the steel layer and the Al-containing metal layer may be suitably adjusted.

As the coating process, the coating is conducted by using coating bath which includes 60 to 100 mass % of Al, 0 to 15 mass % of Si, and 0 to 40 mass % of Cu. The electrolytic-coating or the nonelectrolytic-coating is conducted for the coating method. By including 0 to 15 mass % of Si and 0 to 40 mass % of Cu, the melting point of the coating bath can be decreased. Thus, the coating bath is utilized.

In order to simplify the coating process by further decreasing the melting point of coating bath, it is preferable to utilize Al-containing coating bath which has a composition in which each element is within a range of plus or minus 5 mass % on the basis of a composition which is 68.2 mass % of Al, 4.7 mass % of Si, and 27.1 mass % of Cu or a composition which is 68 mass % of Al and 32 mass % of Cu.

As the second rolling process, the rolling is conducted so that a thickness is to be 10 to 250 μm. A rolling condition thereof may be an ordinary rolling condition. When the thickness of the metal foil is less than 10 μm, the thickness may be excessively thin as the metal foil for the base materials, so that the strength is insufficient. Moreover, when the thickness of the metal foil is more than 250 μm, the thickness may be excessively thick for the metal foil for the base materials, so that weight is excessive.

In addition, in order to control the protruding defect of the surface of the Al-containing metal layer and the glossiness of the surface of the Al-containing metal layer of the metal foil, it is preferable to use a rolling roll having a surface roughness Ra of 200 μm or less which is a mirror finished surface for the rolling mill in the second rolling process. The reason why the surface roughness Ra of the rolling roll is controlled to be 200 μm or less is to preferably control the surface of the Al-containing metal layer.

In order to further control the protruding defect of the surface of the Al-containing metal layer and the glossiness of the surface of the Al-containing metal layer, it is preferable that a bright-finished rolling is conducted as required for the metal foil after the second rolling process as a skin-pass rolling process. In the skin-pass rolling process, it is preferable to use a rolling roll having a surface roughness Ra of 1 μm or less which is a mirror finished surface. The reason why the surface roughness Ra of the rolling roll is controlled to be 1 μm or less is to preferably control the surface of the Al-containing metal layer.

It is preferable that the thickness of the Al-containing metal layer of the metal foil after the second rolling process or the skin-pass rolling process is 0.1 to 30 μm. When less than 0.1 μm, the sufficient corrosion resistance may not be obtained. When more than 30 μm, it is necessary to excessively coat Al, and the production cost may increase. Preferably, the thickness of the Al-containing metal layer may be 1 to 30 μm. More preferably, the thickness of the Al-containing metal layer may be 3 to 30 μm. Most preferably, the thickness of the Al-containing metal layer may be 8 to 30 μm.

In addition, as required, it is preferable to conduct a heating process in order to form the AlN layer so as to be dense on the surface of the Al-containing metal layer of the metal foil after the second rolling process or the skin-pass rolling process. The process is to heat the metal foil in a temperature range of 500° C. to 600° C. for 1 hour to 10 hours in an inert gas (argon, nitrogen, nitrogen+hydrogen, or the like) containing an ammonia or a hydrazine of 10 volume %±2 volume %.

Similarly, it is preferable to anodize the surface of the Al-containing metal layer by an anodic oxidation method, as an anodizing process, in order to form the $Al_2O_3$ layer so as to be dense on the surface of the Al-containing metal layer of the metal foil after the second rolling process or the skin-pass rolling process. A sulfuric acid alumite, an oxalic acid alumite, a chromic acid alumite, or the like, which is well-known, may be applied to the process condition. In particular, the sulfuric acid alumite is most preferable from an economic standpoint and an industrial standpoint. However, since the metal foil is thin and may be deformed during the anodizing process, it is important to promptly water-cool the metal foil after finishing the anodizing process in order to maintain the flatness of the metal foil.

In addition, a sputtering method, an evaporation method, or the like may be applied in order to form the Cr layer or the Ni layer on the surface of the Al-containing metal layer with comparative ease. In particular, an electrocoating method is preferable in order to form the Cr layer or the Ni layer so as to be dense and uniform. Thus, it is preferable to conduct the coating, as an electrocoating process, in order to form the Cr layer or the Ni layer so as to be dense on the surface of the Al-containing metal layer of the metal foil after the second rolling process or the skin-pass rolling process.

Similarly, it is preferable to conduct a film-forming process for a sol-gel layer, in order to form the sol-gel layer on the surface of the Al-containing metal layer of the metal foil after the second rolling process or the skin-pass rolling process. Firstly, when the hydrogen concentration is [H] (mol/l) and the Si concentration is [Si] (mol/l) in the sol-gel layer which is obtained by a finally baking treatment, a sol in which the ratio of [H] to [Si] satisfies $0.1 \leq [H]/[Si] \leq 10$ is prepared. Next, the prepared sol is applied to the surface of the Al-containing metal layer of the metal foil, and is dried. Finally, the baking treatment is conducted after drying. As a result, it is possible to produce the metal foil having the coating which is an inorganic-organic hybrid film.

Similarly, it is preferable to conduct a film-forming process for a lamination layer, in order to form the lamination layer on the surface of the Al-containing metal layer of the metal foil after the second rolling process or the skin-pass rolling process. It is possible to form the lamination layer by a heat laminating method in which the laminate, which is made of the plastic film or the like selected from the polyolefin, the polyester, the polyamide, and the polyimide, is placed on the surface of the Al-containing metal layer of the metal foil with a nylon adhesive, is heated, and is thermocompressed under pressure of approximately 1 MPa.

EXAMPLES

Hereinafter, the effects of an aspect of the present invention will be described in detail with reference to the following examples. However, the condition in the examples is an example condition employed to confirm the operability and the effects of the present invention, so that the present invention is not limited to the example condition. The present invention can employ various types of conditions as long as the conditions do not depart from the scope of the present invention and can achieve the object of the present invention.

Experiment 1

In Experiment 1, as the first rolling process, the rolled steel sheet having a thickness of 300 μm was obtained by hot-rolling or cold-rolling the ultra low carbon steel. In the pre-coating process, the pure Cu or the pure Ni pre-coating film was formed on the rolled steel sheet by the electrolytic-coating method. Watts bath was used as the coating bath for the electrolytic-Ni-coating and copper sulfate bath was used as the coating bath for the electrolytic-Cu-coating. As the coating process, a hot-dip aluminizing was conducted by immersing the rolled steel sheet after the pre-coating process in the Al-containing metal for 20 seconds. As the second rolling process, the metal foil was obtained by rolling the rolled steel sheet after the coating process under rolling reduction of 10 to 20% per each pass. As required, the skin-pass rolling process was conducted by using some of the metal foil after the second rolling process. The thicknesses of the pre-coating film and the Al-containing metal layer were preliminary calculated and determined so that each layer was controlled to be the thickness indicated in Table 1.

A surface state and a state of each constituent layer of the obtained metal foil were confirmed by observing metallographic structure of the cross-section of the metal foil that was planarly cut along the normal direction so that the observed section was the transverse direction perpendicular to the rolling direction. The observation of the metallographic structure was conducted under a magnification in which a visual field was to be 20 µm or less in the transverse direction, and at least 15 visual fields or more were observed so that the total visual field was to be 300 µm or more in the transverse direction. The contour curve and the contour average straight line were obtained by the image analysis. Each constituent layer was identified on the cross-section by the Energy Dispersive X-Ray Analysis (EDX). The hardness of the alloy layer was measured on the cross-section by a Vickers hardness tester. The results are shown in Table 1. The underlined value in the Table indicates out of the range of the present invention. When hole which was called as void was observed in the observation of the cross-section, the void is indicated as "existence" in Table 1.

In addition, a corrosion test, a 180° closely-contact-bending test, and a glossiness measurement were conducted by using the obtained metal foil. In the same way, the results are shown in Table 1. The underlined value in the Table indicates out of the range of the present invention.

The corrosion test was conducted as a salt spray test (SST). 5% NaCl solution which was held at 35° C. was sprayed. Consequently, the case where the corrosion was not visually observed for 400 hours or longer was judged to be VG (Very Good), that for 300 hours or longer was judged to be G (Good), that for 100 hours or longer was judged to be NG (Not Good), and that for shorter than 100 hours was judged to be B (Bad). NG and B were considered to be unacceptable.

Moreover, as severe corrosion test, 10% NaCl solution which was held at 50° C. was sprayed to the metal foil which was cut to 150 mm×70 mm. The case where the surface of the metal foil was not corroded for 600 hours was judged to be EG (Extremely Good), which is considered as most preferable corrosion resistance. The case where the surface of the metal foil was not corroded for 500 hours was judged to be GG (Greatly Good). The case where the surface of the metal foil was not corroded for 400 hours was judged to be VG (Very Good). The case where the surface of the metal foil was not corroded for 300 hours was judged to be G (Good). The case where the surface of the metal foil was not corroded for 100 hours was judged to be NG (Not Good). The case where the surface of the metal foil was corroded for less than 100 hours was judged to be B (Bad). NG and B were considered to be unacceptable.

The 180° closely-contact-bending test was conducted by repeating the 180° closely-contact-bending in which an inside radius was zero and a bending angle was 180° to the metal foil, and a bending number at which the exfoliation or crack of the coating occurred was investigated. Observation of the exfoliation or the crack of the coating was conducted by observing a bended periphery of the metal foil every a cycle of the 180° closely-contact-bending by an optical microscope. The bending number at which the exfoliation or the crack of the coating was observed by the optical microscope was defined as a coating fracture number. When the coating fracture number was 3 times or more, the elastoplastic deformability was judged to be acceptable.

The glossiness measurement was conducted by measuring a ratio of reflectance of the metal foil to that of the silver mirror by using a gloss meter when light entered by an angle of incidence of 60°. The glossiness of less than 75% was judged to be NG (Not Good), that of 75% or more and less than 80% was judged to be G (Good), that of 80% or more and less than 90% was judged to be VG (Very Good), and that of 90% or more was judged to be GG (Greatly Good). NG was considered to be unacceptable.

TABLE 1

| | | | | PRODUCTION RESULTS | | | |
|---|---|---|---|---|---|---|---|
| | | | Cu LAYER OR Ni LAYER | | ALLOY LAYER | | |
| | | THICKNESS OF STEEL LAYER (µm) | MATERIAL | THICKNESS (µm) | MATERIAL | THICKNESS (µm) | VICKERS HARDNESS (Hv) |
| EXAMPLE | 1 | 10 | — | 0 | $Al_7Cu_2Fe$ | 0.1 | 500 |
| | 2 | 10 | — | 0 | $Al_7Cu_2Fe$ | 0.1 | 500 |
| | 3 | 50 | — | 0 | $Al_7Cu_2Fe$ | 0.5 | 500 |
| | 4 | 100 | — | 0 | $Al_7Cu_2Fe$ | 1 | 500 |
| | 5 | 200 | — | 0 | $Al_7Cu_2Fe$ | 2 | 500 |
| | 6 | 10 | — | 0 | $Al_7Cu_2Fe$ | 3 | 500 |
| | 7 | 40 | — | 0 | $Al_7Cu_2Fe$ | 4 | 500 |
| | 8 | 80 | — | 0 | $Al_7Cu_2Fe$ | 5 | 500 |
| | 9 | 150 | — | 0 | $Al_7Cu_2Fe$ | 6 | 500 |
| | 10 | 200 | — | 0 | $Al_7Cu_2Fe$ | 8 | 500 |
| | 11 | 10 | — | 0 | $FeAl_3$ BASED | 0.1 | 600 |
| | 12 | 50 | — | 0 | $FeAl_3$ BASED | 0.5 | 600 |

TABLE 1-continued

|  |  |  |  |  |  |  |  |
|---|---|---|---|---|---|---|---|
|  | 13 | 100 | — | 0 | FeAl₃ BASED | 1 | 600 |
|  | 14 | 200 | — | 0 | FeAl₃ BASED | 2 | 600 |
|  | 15 | 10 | — | 0 | FeAl₃ BASED | 3 | 600 |
|  | 16 | 40 | — | 0 | FeAl₃ BASED | 4 | 600 |
|  | 17 | 80 | — | 0 | FeAl₃ BASED | 5 | 600 |
|  | 18 | 150 | — | 0 | FeAl₃ BASED | 6 | 600 |
|  | 19 | 200 | — | 0 | FeAl₃ BASED | 8 | 600 |
|  | 20 | 10 | Cu | 2 | Al₇Cu₂Fe | 8 | 500 |
|  | 21 | 10 | Cu | 5 | Al₇Cu₂Fe | 8 | 500 |
|  | 22 | 10 | Cu | 10 | Al₇Cu₂Fe | 8 | 500 |
|  | 23 | 50 | Cu | 2 | Al₇Cu₂Fe | 8 | 500 |
|  | 24 | 50 | Cu | 5 | Al₇Cu₂Fe | 8 | 500 |
|  | 25 | 50 | Cu | 10 | Al₇Cu₂Fe | 8 | 500 |
|  | 26 | 100 | Cu | 2 | Al₇Cu₂Fe | 8 | 500 |
|  | 27 | 100 | Cu | 5 | Al₇Cu₂Fe | 8 | 500 |
|  | 28 | 100 | Cu | 10 | Al₇Cu₂Fe | 8 | 500 |
|  | 29 | 80 | Ni | 2 | FeAl₃ BASED | 8 | 600 |
|  | 30 | 80 | Ni | 5 | FeAl₃ BASED | 8 | 600 |
|  | 31 | 80 | Ni | 10 | FeAl₃ BASED | 8 | 600 |
| COMPARATIVE EXAMPLE | 1 | 10 | — | 0 | <u>NONE</u> | <u>0</u> | — |
|  | 2 | 200 | Cu | 15 | Al₇Cu₂Fe | <u>10</u> | 500 |
|  | 3 | 10 | — | 0 | <u>Fe₂Al₃Si</u> | 7 | 900 |
|  | 4 | 80 | Ni | 2 | <u>FeAl₃ BASED</u> | 8 | 600 |

|  |  | PRODUCTION RESULTS |  |  | TEST RESULTS |  |  |  |
|---|---|---|---|---|---|---|---|---|
|  |  | Al-CONTAINING METAL LAYER |  | EXISTENCE OF |  |  |  |  |
|  |  | MATERIAL | THICKNESS (μm) | VOID ON CROSS SECTION (1) | CORROSION TEST | SEVERE CORROSION TEST | 180° BENDING TEST | GLOSSINESS |
| EXAMPLE | 1 | Al | 0.05 | NONE | NONE | G | G | 5 | GG |
|  | 2 | Al | 0.1 | NONE | NONE | G | G | 7 | GG |
|  | 3 | Al-6 wt % Si | 10 | NONE | NONE | G | VG | 7 | GG |
|  | 4 | Al-10 wt % Si | 20 | NONE | NONE | G | GG | 7 | GG |
|  | 5 | Al-10 wt % Cu | 30 | NONE | NONE | G | GG | 8 | GG |
|  | 6 | Al-32 wt % Cu | 1 | NONE | NONE | VG | VG | 8 | VG |
|  | 7 | Al-5 wt % Si-27 wt % Cu | 5 | NONE | NONE | VG | VG | 8 | G |
|  | 8 | Al-1 wt % Si | 15 | NONE | NONE | VG | GG | 9 | GG |
|  | 9 | Al-9 wt % Si | 25 | NONE | NONE | VG | EG | 9 | GG |
|  | 10 | Al-15 wt % Si | 30 | NONE | NONE | VG | EG | 10 | VG |
|  | 11 | Al-1 wt % Cu | 0.1 | NONE | NONE | G | G | 5 | GG |
|  | 12 | Al-5 wt % Cu | 10 | NONE | NONE | G | VG | 5 | GG |
|  | 13 | Al-20 wt % Cu | 20 | NONE | NONE | G | GG | 5 | VG |
|  | 14 | Al-40 wt % Cu | 30 | NONE | NONE | G | GG | 6 | G |
|  | 15 | Al-5 wt % Si-27 wt % Cu | 1 | NONE | NONE | VG | VG | 6 | G |
|  | 16 | Al-6 wt % Si | 5 | NONE | NONE | VG | VG | 6 | GG |
|  | 17 | Al-10 wt % Si | 15 | NONE | NONE | VG | GG | 7 | GG |
|  | 18 | Al-6 wt % Si | 25 | NONE | NONE | VG | EG | 7 | GG |
|  | 19 | Al-10 wt % Si | 30 | NONE | NONE | VG | EG | 8 | GG |
|  | 20 | Al | 0.1 | NONE | NONE | G | G | 10 | GG |
|  | 21 | Al | 0.1 | NONE | NONE | G | G | 10 | GG |
|  | 22 | Al | 0.1 | NONE | NONE | G | G | 10 | GG |
|  | 23 | Al-6 wt % Si | 10 | NONE | NONE | G | VG | 10 | GG |
|  | 24 | Al-6 wt % Si | 10 | NONE | NONE | G | VG | 10 | GG |
|  | 25 | Al-6 wt % Si | 10 | NONE | NONE | G | VG | 10 | GG |
|  | 26 | Al-10 wt % Si | 20 | NONE | NONE | G | GG | 10 | GG |
|  | 27 | Al-10 wt % Si | 20 | NONE | NONE | G | GG | 10 | GG |
|  | 28 | Al-10 wt % Si | 20 | NONE | NONE | G | GG | 10 | GG |
|  | 29 | Al-10 wt % Si | 15 | NONE | NONE | VG | GG | 8 | GG |
|  | 30 | Al-10 wt % Si | 15 | NONE | NONE | VG | GG | 8 | GG |
|  | 31 | Al-10 wt % Si | 15 | NONE | NONE | VG | GG | 8 | GG |
| COMPARATIVE EXAMPLE | 1 | Al | 0.1 | NONE | NONE | B | B | 1 | GG |
|  | 2 | Al-15 wt % Si | 30 | NONE | EXISTENCE | VG | EG | 2 | G |
|  | 3 | Al-15 wt % Si | 10 | NONE | NONE | G | VG | 2 | G |
|  | 4 | Al-10 wt % Si | 15 | <u>EXISTENCE</u> | NONE | VG | GG | 8 | NG |

THE UNDERLINED VALUE IN THE TABLE INDICATES OUT OF THE RANGE OF THE PRESENT INVENTION.
(1) MAXIMUM POINT WHOSE DISTANCE FROM CONTOUR AVERAGE STRAIGHT LINE IS MORE THAN 10 μm (EXISTENCE)

As shown in Table 1, in regard to the examples 1 to 31, all of the states of the steel layer, the Cu layer or the Ni layer, the alloy layer, and the Al-containing metal layer achieved the target, so that the corrosion resistance, the elastoplastic deformability, the surface smoothness, and the glossiness were satisfied.

On the other hand, in regard to the comparative examples 1 to 4, any one of the states of the steel layer, the Cu layer or the Ni layer, the alloy layer, and the Al-containing metal layer did not achieve the targets, so that any one of the corrosion resistance, the elastoplastic deformability, the surface smoothness, and the glossiness was not satisfied.

In regard to the comparative example 1, since the alloy layer was not formed, the corrosion resistance and the 180° closely-contact-bending property were unacceptable.

In regard to the comparative example 2, since the thickness of the alloy layer was more than 8 μm, the void was observed on the cross-section and the 180° closely-contact-bending property was unacceptable.

In regard to the comparative example 3, since the alloy layer was the conventional alloy layer which was hard and brittle, the Vickers hardness of the alloy layer was 900 Hv and the 180° closely-contact-bending property was unacceptable.

In regard to the comparative example 4, the maximum point whose distance from the contour average straight line was more than 0.5 μm existed. Also the glossiness was unacceptable.

Experiment 2

In Experiment 2, the AlN layer, the $Al_2O_3$ layer, the Cr layer, the Ni layer, the sol-gel layer, or the lamination layer was formed on the metal foil which was prepared in common with the Experiment 1, the thickness thereof was changed, and the CIGS photoelectric conversion efficiency was investigated. The CIGS photoelectric conversion efficiency of less than 8% was judged to be NG (Not Good), that of 8% or more and less than 10% was judged to be G (Good), that of 10% or more and less than 12% was judged to be VG (Very Good), and that of 12% or more was judged to be GG (Greatly Good). NG was considered to be unacceptable.

The AlN layer was formed by the heating process with the inert gas including the ammonia. The $Al_2O_3$ layer was formed by the sulfuric acid alumite treatment. The Cr layer and the Ni layer were formed by the sputtering method.

In the formation of the sol-gel layer, a mixture of methyltriethoxysilane of 10 mol and tetraethoxysilane of 10 mol was used as starting material for sol preparation, ethanol of 20 mol was added to the mixture, and the mixture was sufficiently stirred. Thereafter, with stirring, hydrolysis was conducted by dropping acetic acid solution in which acetic acid of 2 mol and water of 100 mol were mixed. Ethanol of 100 mol was added to sol which was prepared as mentioned above, so that conclusive sol was obtained. The sol was applied to both surfaces of the coated plain steel foil by dip coating method, and was dried at 100° C. for 1 minute in air. Thereafter, by heating from room temperature to 400° C. at a heating rate of 10° C./minute in nitrogen and by baking at 400° C. for 30 minutes, the sol-gel layer was obtained.

In the formation of the lamination layer, the nylon adhesive was dissolved, so as to be concentration of 15 mass %, in a mixed solvent in which mass ratio of cresol to xylene was 70:30, the solvent was applied to the resin, and the heat laminating was conducted by thermocompressing the resin to the coated plain steel foil, which was heated to 300° C., under pressure of 1 MPa. The results are shown in Table 2.

TABLE 2

| | | THICKNESS OF STEEL LAYER (μm) | Cu LAYER OR Ni LAYER | | ALLOY LAYER | | | Al-CONTAINING METAL LAYER | | |
| | | | MATERIAL | THICKNESS (μm) | MATERIAL | THICKNESS (μm) | VICKERS HARDNESS (Hv) | MATERIAL | THICKNESS (μm) | (2) |
|---|---|---|---|---|---|---|---|---|---|---|
| EXAMPLE | 32 | 10 | — | 0 | $Al_7Cu_2Fe$ | 0.1 | 500 | Al | 0.1 | NONE |
| | 33 | 10 | — | 0 | $Al_7Cu_2Fe$ | 0.1 | 500 | Al | 0.1 | NONE |
| | 34 | 10 | — | 0 | $Al_7Cu_2Fe$ | 0.1 | 500 | Al | 0.1 | NONE |
| | 35 | 10 | — | 0 | $Al_7Cu_2Fe$ | 0.1 | 500 | Al | 0.1 | NONE |
| | 36 | 50 | — | 0 | $Al_7Cu_2Fe$ | 0.5 | 500 | Al-6 wt % Si | 10 | NONE |
| | 37 | 50 | — | 0 | $Al_7Cu_2Fe$ | 0.5 | 500 | Al-6 wt % Si | 10 | NONE |
| | 38 | 50 | — | 0 | $Al_7Cu_2Fe$ | 0.5 | 500 | Al-6 wt % Si | 10 | NONE |
| | 39 | 50 | — | 0 | $Al_7Cu_2Fe$ | 0.5 | 500 | Al-6 wt % Si | 10 | NONE |
| | 40 | 100 | — | 0 | $Al_7Cu_2Fe$ | 1 | 500 | Al-10 wt % Si | 20 | NONE |
| | 41 | 100 | — | 0 | $Al_7Cu_2Fe$ | 1 | 500 | Al-10 wt % Si | 20 | NONE |
| | 42 | 100 | — | 0 | $Al_7Cu_2Fe$ | 1 | 500 | Al-10 wt % Si | 20 | NONE |
| | 43 | 100 | — | 0 | $Al_7Cu_2Fe$ | 1 | 500 | Al-10 wt % Si | 20 | NONE |
| | 44 | 80 | — | 0 | $FeAl_3$ BASED | 5 | 600 | Al-10 wt % Si | 15 | NONE |
| | 45 | 80 | — | 0 | $FeAl_3$ BASED | 5 | 600 | Al-10 wt % Si | 15 | NONE |
| | 46 | 80 | — | 0 | $FeAl_3$ BASED | 5 | 600 | Al-10 wt % Si | 15 | NONE |
| | 47 | 80 | — | 0 | $FeAl_3$ BASED | 5 | 600 | Al-10 wt % Si | 15 | NONE |
| | 48 | 100 | Cu | 2 | $Al_7Cu_2Fe$ | 8 | 500 | Al-10 wt % Si | 20 | NONE |
| | 49 | 100 | Cu | 2 | $Al_7Cu_2Fe$ | 8 | 500 | Al-10 wt % Si | 20 | NONE |
| | 50 | 100 | Cu | 2 | $Al_7Cu_2Fe$ | 8 | 500 | Al-10 wt % Si | 20 | NONE |
| | 51 | 100 | Cu | 2 | $Al_7Cu_2Fe$ | 8 | 500 | Al-10 wt % Si | 20 | NONE |
| | 52 | 80 | Ni | 5 | $FeAl_3$ BASED | 8 | 600 | Al-10 wt % Si | 15 | NONE |
| | 53 | 80 | Ni | 5 | $FeAl_3$ BASED | 8 | 600 | Al-10 wt % Si | 15 | NONE |
| | 54 | 80 | Ni | 5 | $FeAl_3$ BASED | 8 | 600 | Al-10 wt % Si | 15 | NONE |
| | 55 | 80 | Ni | 5 | $FeAl_3$ BASED | 8 | 600 | Al-10 wt % Si | 15 | NONE |
| | 56 | 50 | Cu | 2 | $Al_7Cu_2Fe$ | 8 | 500 | Al-6 wt % Si | 10 | NONE |
| | 57 | 50 | Cu | 2 | $Al_7Cu_2Fe$ | 8 | 500 | Al-6 wt % Si | 10 | NONE |

TABLE 2-continued

| | | | | | | | | | | |
|---|---|---|---|---|---|---|---|---|---|---|
| 58 | 50 | Cu | 2 | Al$_7$Cu$_2$Fe | 8 | 500 | Al-6 wt % Si | 10 | NONE |
| 59 | 50 | Cu | 2 | Al$_7$Cu$_2$Fe | 8 | 500 | Al-6 wt % Si | 10 | NONE |
| 60 | 50 | Cu | 5 | Al$_7$Cu$_2$Fe | 8 | 500 | Al-6 wt % Si | 10 | NONE |
| 61 | 50 | Cu | 5 | Al$_7$Cu$_2$Fe | 8 | 600 | Al-6 wt % Si | 10 | NONE |
| 62 | 50 | Cu | 5 | Al$_7$Cu$_2$Fe | 8 | 600 | Al-6 wt % Si | 10 | NONE |
| 63 | 50 | Cu | 5 | Al$_7$Cu$_2$Fe | 8 | 600 | Al-6 wt % Si | 10 | NONE |

| | | PRODUCTION RESULTS | | TEST RESULTS | | | | | |
|---|---|---|---|---|---|---|---|---|---|
| | | SURFACE FILM | | EXISTENCE OF VOID ON CROSS SECTION | CORROSION TEST | SEVERE CORROSION TEST | 180° BENDING TEST | GLOSSINESS | CIGS CONVERSION EFFICIENCY |
| | | MATERIAL | THICKNESS (μm) | (3) | | | | | |
| EXAMPLE | 32 | AlN | 0.005 | NONE | NONE | G | G | 7 | GG | G |
| | 33 | AlN | 0.01 | NONE | NONE | G | G | 7 | VG | VG |
| | 34 | AlN | 0.04 | NONE | NONE | G | G | 7 | VG | VG |
| | 35 | AlN | 0.08 | NONE | NONE | G | G | 7 | G | GG |
| | 36 | Cr | 0.06 | NONE | NONE | G | VG | 7 | GG | G |
| | 37 | Cr | 0.1 | NONE | NONE | G | VG | 7 | VG | VG |
| | 38 | Cr | 3 | NONE | NONE | G | VG | 7 | VG | VG |
| | 39 | Cr | 8 | NONE | NONE | G | VG | 7 | G | GG |
| | 40 | Ni | 0.05 | NONE | NONE | G | GG | 7 | GG | G |
| | 41 | Ni | 0.1 | NONE | NONE | G | GG | 7 | VG | VG |
| | 42 | Ni | 3 | NONE | NONE | G | GG | 7 | VG | VG |
| | 43 | Ni | 8 | NONE | NONE | G | GG | 7 | G | GG |
| | 44 | Al$_2$O$_3$ | 0.005 | NONE | NONE | VG | GG | 7 | GG | G |
| | 45 | Al$_2$O$_3$ | 0.01 | NONE | NONE | VG | GG | 7 | VG | VG |
| | 46 | Al$_2$O$_3$ | 15 | NONE | NONE | VG | GG | 7 | VG | VG |
| | 47 | Al$_2$O$_3$ | 50 | NONE | NONE | VG | GG | 7 | G | GG |
| | 48 | Al$_2$O$_3$ | 0.005 | NONE | NONE | G | GG | 10 | GG | G |
| | 49 | Al$_2$O$_3$ | 0.01 | NONE | NONE | G | GG | 10 | VG | VG |
| | 50 | Al$_2$O$_3$ | 15 | NONE | NONE | G | GG | 10 | VG | VG |
| | 51 | Al$_2$O$_3$ | 50 | NONE | NONE | G | GG | 10 | G | GG |
| | 52 | AlN | 0.005 | NONE | NONE | VG | GG | 8 | GG | G |
| | 53 | AlN | 0.01 | NONE | NONE | VG | GG | 8 | VG | VG |
| | 54 | AlN | 0.04 | NONE | NONE | VG | GG | 8 | VG | VG |
| | 55 | AlN | 0.06 | NONE | NONE | VG | GG | 8 | G | GG |
| | 56 | SOL-GEL | 0.0005 | NONE | NONE | G | VG | 10 | GG | G |
| | 57 | SOL-GEL | 0.001 | NONE | NONE | G | VG | 10 | VG | VG |
| | 58 | SOL-GEL | 0.1 | NONE | NONE | G | VG | 10 | VG | VG |
| | 59 | SOL-GEL | 8 | NONE | NONE | G | VG | 10 | G | GG |
| | 60 | LAMINATION | 0.05 | NONE | NONE | G | VG | 10 | GG | G |
| | 61 | LAMINATION | 0.1 | NONE | NONE | G | VG | 10 | VG | VG |
| | 62 | LAMINATION | 3 | NONE | NONE | G | VG | 10 | VG | VG |
| | 63 | LAMINATION | 8 | NONE | NONE | G | VG | 10 | G | GG |

(2) MAXIMUM POINT WHOSE DISTANCE FROM CONTOUR AVERAGE STRAIGHT LINE IS MORE THAN 10 μm (EXISTENCE)
(3) MAXIMUM POINT WHOSE DISTANCE FROM CONTOUR AVERAGE STRAIGHT LINE IS MORE THAN 10 μm (EXISTENCE)

As shown in Table 2, in regard to the examples 32 to 63, all of the examples showed excellent photoelectric conversion efficiency. In particular, the examples, in which the thickness of the AlN layer, the Al$_2$O$_3$ layer, the Cr layer, the Ni layer, the sol-gel layer, or the lamination layer was preferably controlled, showed exceedingly excellent photoelectric conversion efficiency.

In regard to the examples 33 to 35 and the examples 53 to 55, since the thickness of the AlN layer was preferably controlled, the photoelectric conversion efficiency was exceedingly excellent.

In regard to the examples 37 to 39, since the thickness of the Cr layer was preferably controlled, the photoelectric conversion efficiency was exceedingly excellent.

In regard to the examples 41 to 43, since the thickness of the Ni layer was preferably controlled, the photoelectric conversion efficiency was exceedingly excellent.

In regard to the examples 45 to 47 and the examples 49 to 51, since the thickness of the Al$_2$O$_3$ layer was preferably controlled, the photoelectric conversion efficiency was exceedingly excellent.

In regard to the examples 57 to 59, since the thickness of the sol-gel layer was preferably controlled, the photoelectric conversion efficiency was exceedingly excellent.

In regard to the examples 61 to 63, since the thickness of the lamination layer was preferably controlled, the photoelectric conversion efficiency was exceedingly excellent.

INDUSTRIAL APPLICABILITY

According to the above aspects of the present invention, it is possible to provide the metal foil for the base materials which is not fragile as compared with the glass base materials, is suitably thinned, and simultaneously satisfies the corrosion resistance, the surface smoothness, and the elastoplastic deformability required as the metal foil for the base materials at a low cost.

The invention claimed is:

1. A metal foil for a base material of a solar cell and an organic electroluminescence, the metal foil comprising:
a carbon steel layer whose thickness is 10 to 200 μm;
an alloy layer which contains Fe and Al and which is formed on the carbon steel layer; and
an Al-containing metal layer arranged on the alloy layer,
wherein, a distance between (1) a maximum point of a cutting-plane line of a surface of the Al-containing metal layer appearing on a cross-section of the metal foil that is cut perpendicular to a rolling direction, wherein the cutting-plane line is a contour curve and the maximum point is an extremal point that is convex toward the surface of the Al-containing metal layer, and (2) an approximation straight line of the cutting-plane line, is not more than 10 μm,
wherein a thickness of the alloy layer is 0.1 to 8 μm and the alloy layer contains an $Al_7Cu_2Fe$ intermetallic compound or $FeAl_3$ based intermetallic compounds, and
wherein a Vickers hardness of the alloy layer is 500 Hv to 600 Hv.

2. The metal foil according to claim 1, further comprising a Cu layer whose thickness is 2 to 10 μm or a Ni layer whose thickness is 2 to 10 μm between the carbon steel layer and the alloy layer.

3. The metal foil according to claim 1, wherein a thickness of the Al-containing metal layer is 0.1 to 30 μm.

4. The metal foil according to claim 1, further comprising an AlN layer whose thickness is 0.01 to 0.08 μm or an $Al_2O_3$ layer whose thickness is 0.01 to 50 μm on the Al-containing metal layer.

5. The metal foil according to claim 1, further comprising a Cr layer whose thickness is 0.1 to 8 μm or a Ni layer whose thickness is 0.1 to 8 μm on the Al-containing metal layer.

6. The metal foil according to claim 1, further comprising at least a film selected from a sol-gel layer and a lamination layer on the Al-containing metal layer.

7. The metal foil according to claim 1, wherein a glossiness of the surface of the Al-containing metal layer is 75% or more as compared with a silver mirror.

8. The metal foil according to claim 1, wherein a Cu is solid-soluted in the $FeAl_3$ based intermetallic compounds.

* * * * *